(12) United States Patent
Do et al.

(10) Patent No.: US 10,246,320 B2
(45) Date of Patent: Apr. 2, 2019

(54) PACKAGES AND METHODS OF PACKAGING SENSORS

(71) Applicant: DunAn Sensing, LLC, San Jose, CA (US)

(72) Inventors: Danny (Duy) Do, San Jose, CA (US); Tom Nguyen, San Jose, CA (US); Kevin Cuong Nguyen, San Jose, CA (US); Claudio Martinez, Deer Park, WA (US)

(73) Assignee: DUNAN SENSING, LLC, San Jose, CA (US)

( * ) Notice: Subject to any disclaimer, the term of this patent is extended or adjusted under 35 U.S.C. 154(b) by 0 days.

(21) Appl. No.: 15/220,048

(22) Filed: Jul. 26, 2016

(65) Prior Publication Data

US 2018/0029877 A1 Feb. 1, 2018

(51) Int. Cl.
| | | |
|---|---|---|
| *H01L 29/84* | (2006.01) | |
| *B81B 7/00* | (2006.01) | |
| *B81C 1/00* | (2006.01) | |
| *G01L 19/00* | (2006.01) | |
| *G01L 19/14* | (2006.01) | |

(52) U.S. Cl.
CPC ............ *B81B 7/007* (2013.01); *B81C 1/0023* (2013.01); *B81C 1/00301* (2013.01); *G01L 19/0076* (2013.01); *G01L 19/148* (2013.01); *B81B 2201/0264* (2013.01)

(58) Field of Classification Search
CPC ... B81B 7/0032; B81B 7/0045; B81B 7/0048; B81B 7/0051; B81B 7/007; B81B 7/0041; B81B 7/0074; B81B 7/0077
See application file for complete search history.

(56) References Cited

U.S. PATENT DOCUMENTS

| | | | |
|---|---|---|---|
| 6,389,903 B1 | 5/2002 | Oba et al. | |
| 2009/0314096 A1* | 12/2009 | Colombo | ............ G01L 19/0084 73/754 |
| 2013/0056100 A1 | 3/2013 | Imaizumi et al. | |
| 2015/0369684 A1 | 12/2015 | Nguyen et al. | |

OTHER PUBLICATIONS

European Patent Office, Communication, Extended European Search Report, dated Nov. 30, 2017; Application No. 17183219.9, Applicant: DunAn Sensing, LLC; pp. 1-9.

\* cited by examiner

*Primary Examiner* — Steven H Loke
*Assistant Examiner* — Scott Stowe
(74) *Attorney, Agent, or Firm* — Hackler Daghighian Martino & Novak

(57) ABSTRACT

Sensor packages and methods of assembling a sensor in a sensor package are provided. A preferred embodiment comprises: a base including a sensor coupled to the base wherein the base has at least one electrical connection location and a first mechanical mating interface in the shape of an arc; an electronics package with at least one electrical connection location; and a ring coupled between the base and the electronics package wherein the ring electrically connects the at least one electrical connection location on the base and the at least one electrical connection location on the electronics package and wherein the base has a second mechanical mating interface in the shape of an arc that is reciprocal to the first mating interface.

20 Claims, 2 Drawing Sheets

PACKAGES AND METHODS OF PACKAGING SENSORS

FIELD

The present patent document relates generally to methods of packaging sensor and packages therefor. More specifically, the present patent document relates to methods of packaging Micro-electro-mechanical systems (MEMS) pressure sensors and packages for the same.

BACKGROUND

Sensors are used in a wide variety of applications. As manufacturing techniques continue to allow smaller and smaller sensor designs, sensors are becoming even more widespread. Due to their small size, the use of MEMS sensors is becoming commonplace in areas never thought possible. In all these various applications, the sensors must somehow be mounted or packaged to allow them to perform properly. An effective package must address a number of engineering requirements and is preferably easily manufactured at as low a cost as possible.

One set of problems that sensor packaging must overcome is created by thermal expansion. As may be appreciated, there are thermal concerns for very small sensors like MEMS. The sensor is so small, distortion and disruption of the measured quantity may be significantly affected by thermal mismatch or other thermal issues between the sensor and the packaging or surroundings.

In addition, in many embodiments, the sensor is often required to be hermetically sealed to the packaging. Trying to hermetically seal the sensor to the packaging in a cost effective easily manufactured package also creates challenges.

Accordingly, packaging of MEMS sensors is an important part of a successful implementation. Sensor design has rapidly improved in recent times. Sensor packaging must keep pace. US Patent Application No. 2015/0369684 filed on Jun. 20, 2014, discloses a plurality of embodiments for sensor packaging and that application is incorporated herein by reference in its entirety. The current application provides a number of improvements to the sensor packaging design and methods of packaging a sensor to allow for ease of manufacture and cost reductions.

SUMMARY OF THE EMBODIMENTS

Objects of the present patent document are to provide improved methods for packaging a sensor and packages therefor. To this end, a sensor package is provided. The sensor package comprises: a base including a sensor coupled to the base wherein the base has at least one electrical connection location and a first mechanical mating interface in the shape of an arc; an electronics package with at least one electrical connection location; and a ring coupled between the base and the electronics package wherein the ring electrically connects the at least one electrical connection location on the base and the at least one electrical connection location on the electronics package and wherein the base has a second mechanical mating interface in the shape of an arc that is reciprocal to the first mating interface.

In some embodiments, the first and second mechanical mating interfaces of the base and ring are a groove and protrusion combination. Other types of mechanical mating interfaces may be used. The groove and protrusion may be called by other names such as tongue and groove or dove tail etc. In some embodiments a plurality of mating mechanical interfaces may be used on both the base and the ring. To this end, in some embodiments the ring further comprises a third mechanical mating interface in the shape of an arc and the base further comprises a fourth mechanical mating interface in the shape of an arc that is reciprocal to the third mechanical mating interface.

In preferred embodiments, the depth of the groove is 10% or more greater than the height of the protrusion. The difference in depth and height creates an excess volume a may be filled with adhesive.

In some embodiments, the ring has a via or plurality of vias that pass between the base and the electronics package to provide electrical communication between the base and the electronics package. In many embodiments, recessed pockets are formed around the vias on both sides of the ring.

In some embodiments, the ring may include a recessed ledge designed to receive the electronics package. In such embodiments, a plurality of vias terminate on the recessed ledge in via terminations points and a recessed pocket is formed in the recessed ledge surrounding each via termination point. Each via termination point has a reciprocal via termination point on a bottom side of the ring and the ring has a recessed pocket formed in the bottom side surrounding each reciprocal via termination point.

Any type of sensor may be used but preferably the sensor is a MEMS sensor and more preferably a MEMS pressure sensor. If a pressure sensor is used, it may be mounted to a port that passes through the base. In preferred embodiments the ring and the base is made from ceramic. Other materials may be used in other embodiments.

In some embodiments, the base is disk shape and further comprises a fixture alignment slot on an outside surface of the disk. The fixture alignment slot allows the assembly to be aligned with upper level assemblies.

The sensor package of claim 1, wherein a surface of the ring has a tongue and an outside edge of the electronics package has a reciprocal groove.

In another aspect of the present patent document, methods of assembling a sensor in a sensor package is provided. In preferred embodiment, the method comprises: aligning a ring and base using a first mechanical mating interface in the shape of an arc on the ring and a second mechanical mating interface in the shape of an arc on the base; aligning an electronics package with the ring; filing via holes in the ring with a conductive material such that the base becomes electrically connected to the electronics package; partially filing either the first or second mechanical mating interface with an adhesive; and curing the adhesive such that the base and ring are affixed.

In some embodiment, the assembly method further comprises measuring a volume difference between the first mechanical mating interface and the second mechanical mating interface and metering the amount of adhesive used based on the volume difference.

In preferred embodiments, a conductive epoxy is used to fill the via holes and as the adhesive. Conductive epoxy may also be used to fill the recessed pockets in the ring located on both sides of the vias.

DETAILED DESCRIPTION OF THE PREFERRED EMBODIMENTS

Figure 1:
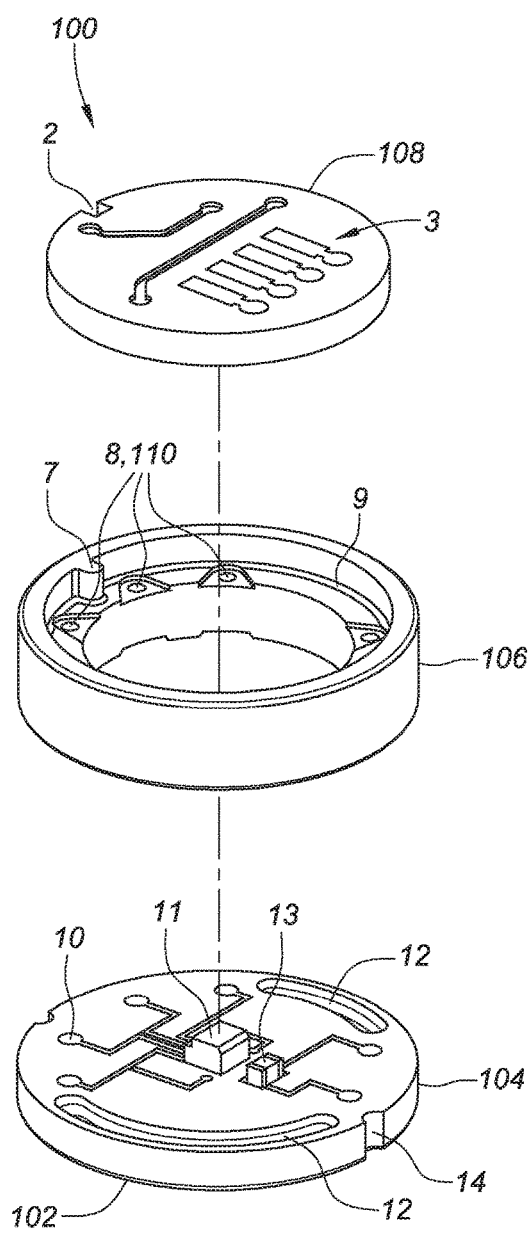
FIG. 1 illustrates an e exploded view of the embodiment of a sensor package 1 viewed from the top side down.

The present patent document discloses sensor packages and methods of packaging a sensor that are more easily manufactured and are more cost effective. FIG. 1 illustrates an isometric exploded view of a sensor package viewed from the top side 3 down. As may be seen in FIG. 1, the sensor package 100 comprises three main components, a base 102, a ring 106 and an electronics platform 108. In the embodiments described herein, the base 102 includes a sensor 11 coupled to the base. In preferred embodiments, the sensor 11 may be a MEMS sensor and even more preferably a MEMS pressure sensor; however, in other embodiments, any type of sensor may be used including piezoelectric sensors, digital sensors or any type of transducer sensor, just to name a few. In addition, the base 102 may have a temperature sensor 13 or thermistor. In other embodiments, other devices may also be included on base 102.

Electronics package 108 is preferably a PCB board with the required electronics need to support the sensor 11. The electronics may include signal conditioning electronics along with other supporting sensor electronics.

As may be appreciated, the electronics in the electronics package 108 needs to be in electrical communication with the sensor 11. U.S. Patent Publication No. 2015/0369684 discloses a number of methods to electrically connect the sensor 11 to the electronics package 108 through the ring 106. All of those methods may be used here. In preferred embodiments of the ring 106, electrical communication between the electronics package 108 and the sensor 11, is created with vias 110 that run through the wall of the ring 106 from the top to the bottom. As may be seen in the embodiment in FIG. 1, the ring 106 has vias 110 that pass between the base 102 and the electronics package 108 to provide electrical communication between the base 102 and the electronics package 108. The vias 110 may be made from solid conductive material in the walls of the ring 106 or the vias 110 may be made from a conductive material injected into via passages during manufacture or assembly. For example, in some embodiments, the vias 110 may be made by injecting a conductive epoxy into via passages in the ring 106 during assembly. The conductive epoxy not only creates the conductive vias 110, it may be used to bond the ring 106 to the electronics package 108 and/or the base 102.

For reference purposes, the size of the package in FIG. 1 is provided. The embodiment of FIG. 1 has an 18 mm diameter. Other embodiments may be any size or shape.

As may be seen in FIG. 1, each via 110, may have a recessed pocket 8 formed around the vias termination point. As may be appreciated, the vias 110 that run through the ring 106 will have a via termination point on the top side and the bottom side of the ring 106. Recessed pockets 8 may be formed around one or more of these via termination points on one side or both sides of the ring 106. The recessed pockets 8 provide two functions. First, the recessed pockets 8 help prevent conductive epoxy overflow when the conductive epoxy is injected into the via passages. Second, the recessed pockets 8 form a larger conductive surface area to ensure a better electrical connection between the electronics package 108 and the base 102.

Figure 2:
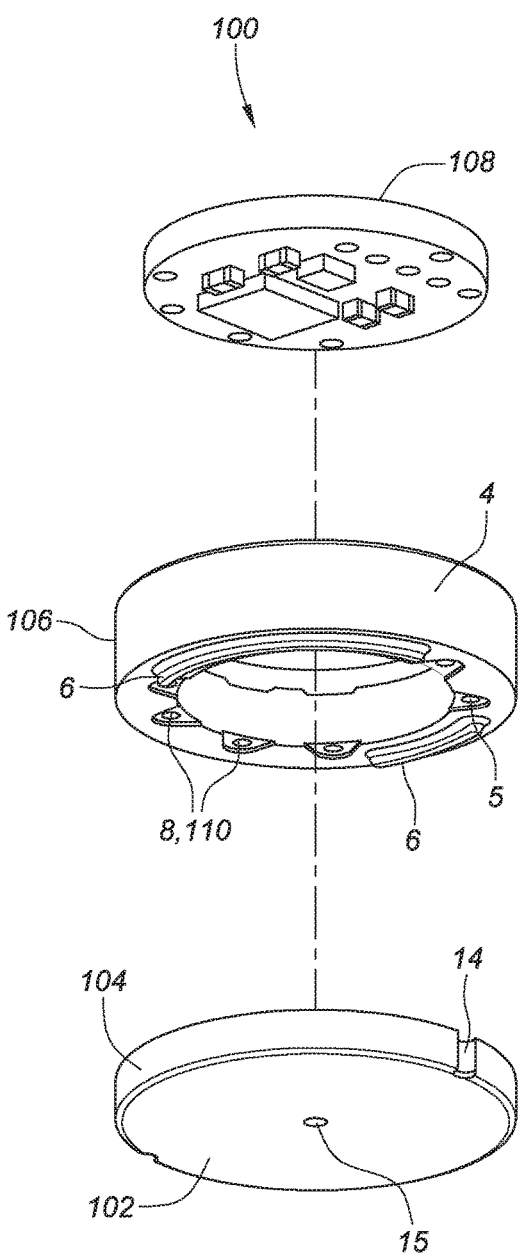
FIG. 2 illustrates an isometric exploded view of the embodiment of a sensor package of FIG. 1 viewed from the port side up.

Looking ahead to FIG. 2, which is a view of the embodiment of FIG. 1 from the bottom instead of the top, it may be seen that each via termination point on the top of the ring 106 may have a reciprocal via termination point on the bottom of the ring 106 as the vias extend from the top to the bottom of the ring 106. In some embodiments, the via termination points on the bottom of the ring 106 may also have recessed pockets 8.

Returning to FIG. 1, in some embodiments, the wall of the ring 106 may include a recessed ledge 9 to create a mating interface for the electronics package 108. The embodiment shown in FIG. 1 has a recessed ledge 9 in the top of the ring 106 for the electronics package 108. In some embodiments, the inside surface of the ring 106 and the outside surface of the electronics package 108 may have a tongue 7 and groove 2 such that the electronics package 108 may be correctly aligned when assembled to the ring 106. The tongue 7 may be on the inside surface of the ring 106 or the outside surface of the electronic package 108 with the groove 2 placed on the reciprocal part.

In other embodiments, the ring 106 may also have a ledge 9 on the bottom for the base 102. As may be seen in FIG. 1, if the ring 106 has a ledge 9, then the vias may be formed through the recessed ledge 9. To this end, the vias may terminate in the recessed ledge 9 and the recessed pockets 8 may be formed for the vias in the ledge 9.

As may be seen by looking at the base 102 in FIG. 1, the base 102 may have one or more electrical connection locations 10. These electrical connection locations 10 may be conductive pads. The electrical connection locations 10 are patterned and located such that they can be aligned with the vias termination points in the ring 106. As may be seen in FIG. 1, the electrical connection locations 10 are located near the outside edge of the base 102 such that these electrical connection locations 10 may be aligned with the via termination points on the ring 106. To this end, electrical traces may be used to extend the locations of the electrical connection locations 10 away from the interior of the base 102 to the outer portions of the base 102.

In a similar manner, the electronics package 102 has one or more electrical connection locations 10. The electrical connection location 10 on the electronics package 102 are patterned and spaced such that they can be aligned with the electrical connection locations on the base 102. As explained above, the ring 106 has vias that run through the wall. These vias are also spaced and pattered such that when the electrical package 108, the ring 106 and the base 102 are all assembled, the ring 106 electrically connects the electrical connection locations 10 on the base 102 to the electrical connection of the electronics package 108.

As may be appreciated, in order to electrically connect the electrical connection locations 10 on the base 102 with the via termination points on the bottom of the ring 106, the base 102 and the ring 106 need to be aligned. To this end, the base 102 may have a mechanical mating interface 12. If the base has a mechanical mating interface 12, the ring 106 will need to have a reciprocal mechanical mating interface. FIG. 2 illustrates an isometric exploded view of the embodiment of a sensor package 100 of FIG. 1 viewed from the port side up. As may be seen in FIG. 2, the ring 106 has reciprocal mechanical mating interfaces 6 to the mechanical mating interfaces 12 of the base 102 in FIG. 1.

As used herein, the term "mechanical mating interface" means an interface that is a groove, cut, channel or other depression with a corresponding protrusion on another part. A "mechanical mating interface" provides mechanical alignment of two parts. This should be contrasted with a "mating interface." A "mating interface" is simply two interfaces that are designed to be mated together. For example, the entire top surface of the base 102 is a mating interface with the bottom surface of the ring 106, however, neither surface is a "mechanical mating interface" as used herein. In contrast, the grooves 12 in the base 102 and the protrusion 6 in the ring 106, are both examples of embodiments of a "mechanical mating interface."

The embodiment of a mechanical mating interface 12 shown in the base 102 is a groove. However, the mechanical mating interface 12 may be a slot, channel, depression or other type of mechanical mating interface 12 in other embodiments. The mechanical mating interface 6 in the ring 106, is a protrusion. The protrusion 6 may be any type of protrusion. The protrusion should be sized and shaped such that it is reciprocal and may receive the corresponding mechanical mating interface on the other piece. It should be understood that a mechanical mating interface may be a groove or protrusion as long as the reciprocal mechanical mating interface is the opposite. In the embodiment, shown in FIGS. 1 and 2, a groove is used on the base 102 and a protrusion is used on the ring 106. However, the claims would still be infringed even if a protrusion is used on the base 102 and the grove was placed on the ring 106. To this end, mechanical mating interface is intended to cover both embodiments. Preferably, the groove is placed on the base 102 as it allows gravity to assist in the flow of adhesive into the mechanical mating interface during manufacture and assembly.

In various embodiments, any number of mechanical mating interfaces may be used between the base 102 and the ring 106. In the embodiment shown in FIGS. 1 and 2, two grooves are shown on the base 102 and two protrusions are shown on the ring 106. However, in other embodiments, a single mechanical mating interface or more than two mechanical mating interfaces may be used.

As may be seen in FIG. 1, the groove 12 and the reciprocal protrusion 6, are in the shape of an arc. An arc is the preferred shape because it maximizes the area of the mechanical mating interface between the base 102 and the ring 106. Maximizing the area of the mechanical mating interface provides the benefit of a better alignment and also more coupling surface for coupling the ring 106 to the base 102. An increased in area allows more mechanical mating interface and more adhesive to be used between the ring 106 and the base 102.

In embodiments with more than one arc shaped mechanical mating interface, the arcs of the mechanical mating interfaces may be of different lengths such that there is a long arc and a short arc or a plurality of arcs of different lengths.

Figure 3:
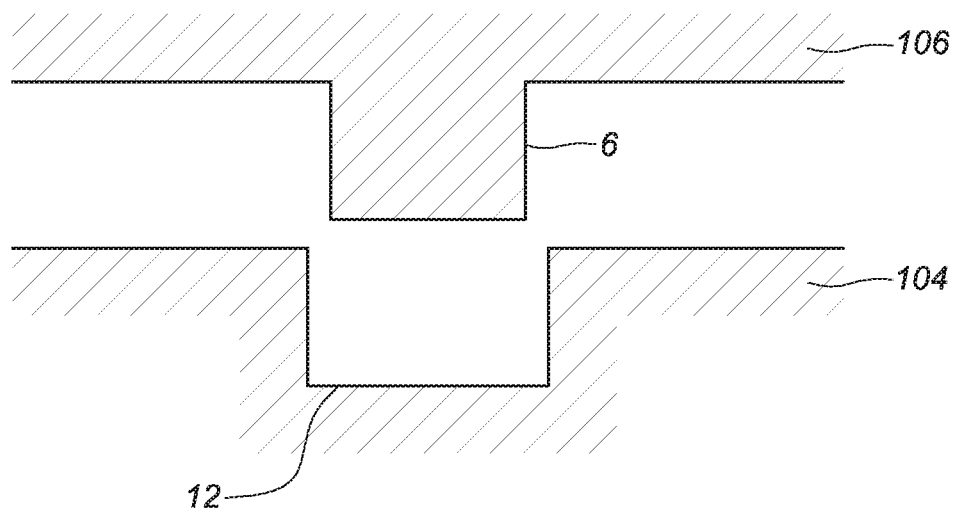
FIG. 3 illustrates a cross-section of mechanical mating interface that include a protrusion and a groove.

FIG. 3 illustrates a cross-section of a protrusion 6 and its reciprocal groove 12. In preferred embodiments, the dimensions of the protrusion 6 are purposely made enough smaller than the dimensions of the groove 12 to allow for an adhesive to be used between the protrusion 6 and the groove 12. To this end, the depth of the groove 12 may be 10% or more greater than the height of the protrusion 6. In other embodiments, the depth of the groove 12 may be 15%, 20% or even 25% more than the height of the groove 12. Similarly, the width of the groove 12 may be 10% greater than the width of the protrusion. In some embodiments, the width of the groove 12 may be 15%, 20% or even 25% greater than the width of the protrusion 6. Accordingly, the volume created by the groove 12 is larger than the volume created by the protrusion 6. In such embodiments, the excess volume of the groove that is not filled by the protrusion may be filled with adhesive. In some embodiments, the adhesive may be conductive epoxy.

Figure 4:
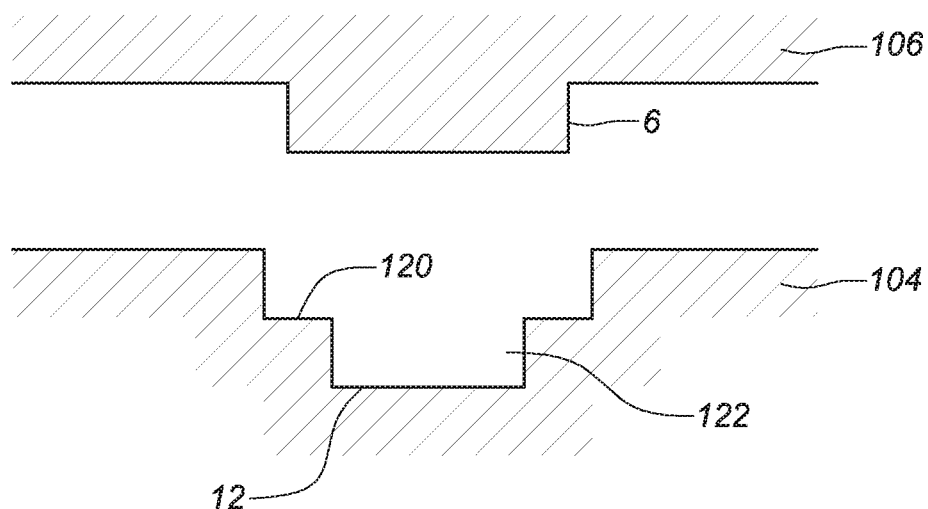
FIG. 4 illustrates a cross-section of another embodiment of a mechanical mating interface.

FIG. 4 illustrates a cross-section of another embodiment of a protrusion 6 and its reciprocal groove 12. As may be seen in FIG. 4, the groove 12 may include a step 120 to form a pocket 122. The reciprocal protrusion 6 may be designed to stay above the ledge 120 such that the pocket 122 can be used to form a reservoir of adhesive. At the same time, the width of the protrusion 6 may be smaller than the width of the groove 12 to allow adhesive to be captured between the sides of the protrusion 6 and the groove 12.

In operation, the mechanical mating interfaces in the form of the groove 12 and protrusion 6, ensure alignment of the base 102, the ring 106 and the electronics package 108 during assembly. During assembly, the ring and base may be aligned by mating the arc shaped mechanical mating interface on the ring 106 with the reciprocal arc shaped mechanical mating interface on the base 102. Next, the electronics package 108 may be aligned with the ring 106. The via holes in the ring 106 are filled with a conductive material such that the base becomes electrically connected to the electronics package 108. In preferred embodiments, the conductive material may be a conductive epoxy. An adhesive may also be placed in either the mechanical mating interface in the base 102 or in the ring 106 or both. Preferably, the adhesive is also a conductive epoxy.

In preferred embodiments, the difference in volume between the protrusion 6 and the groove 12 may be calculated or measured and an amount of adhesive corresponding to the difference in volume is applied. Purposely designing the protrusion and groove with different volumes and calculating the volume in order to determine how much adhesive to use helps prevent excess epoxy from squeezing into unwanted places when assembly occurs. To this end, the amount of adhesive that is applied to the mechanical mating interfaces may be metered.

Returning to FIG. 2, it may be seen that the base 102 may include a port 15 that extends through the base 102. In preferred embodiments, the sensor 11 may be hermetically sealed to the base 102 around the port 15. In such embodiments, the back side of a diaphragm of the sensor may be exposed to the port 15 such that it can measure a change in pressure. In other embodiments, other sensor types and configuration may be used.

The ring 106 and the base 102 may be made from a variety of different materials including metal, plastic, ceramic or some other type of material. In preferred embodiments, both the ring 106 and the base 102 are made of ceramic.

The base 102 is preferably disk shaped. In such embodiments, the base 102 has an outside surface 104. The outside surface 104 of the base 102 may include a fixture alignment slot 14. These slots allow the entire assembly to be aligned in an upper level assembly when assembled.

Although the inventions have been described with reference to preferred embodiments and specific examples, it will readily be appreciated by those skilled in the art that many modifications and adaptations of the methods and devices described herein are possible without departure from the spirit and scope of the inventions as claimed hereinafter. Thus, it is to be clearly understood that this description is made only by way of example and not as a limitation on the scope of the embodiments as claimed hereafter.

What is claimed is:

1. A sensor package comprising:
a base including a sensor coupled to the base wherein the base has a first electrical connection location and a first mechanical mating interface in the shape of an arc;
an electronics package with a second electrical connection location; and
a ring coupled between the base and the electronics package and having a recessed ledge on a top side of the rind designed to receive the electronics package, wherein the ring electrically connects the first electrical connection location to the second electrical connection location and wherein the ring has a second mechanical mating interface in the shape of an arc that is reciprocal to the first mating interface; and
a plurality of vias that terminate on the recessed ledge in first via termination points and wherein a first recessed pocket is formed in the recessed ledge surrounding each first via termination point.

2. The sensor package of claim 1, wherein the first and second mechanical mating interfaces are a groove and protrusion combination.

3. The sensor package of claim 2, wherein a depth of the groove is 10% or more greater than a height of the protrusion.

4. The sensor package of claim 3, wherein the excess volume of the groove that is not filled by the protrusion is filled with adhesive.

5. The sensor package of claim 1, wherein each via of the plurality of vias passes between the base and the electronics package to provide electrical communication between the base and the electronics package.

6. The sensor package of claim 5, wherein the plurality of vias terminate on a bottom side of the ring in second via termination points and a second recessed pocket is formed around each of the second via termination points.

7. The sensor package of claim 1, wherein each first via termination point has a reciprocal via termination point on a bottom side of the ring and wherein the ring has a second recessed pocket formed in the bottom side surrounding each reciprocal via termination point.

8. The sensor package of claim 1, wherein the sensor is a MEMS sensor.

9. The sensor package of claim 8, wherein the MEMS sensor is a pressure sensor that is mounted to a port that passes through the base.

10. The sensor package of claim 1, wherein the base and the ring are both made from ceramic.

11. The sensor package of claim 1, wherein the base is disk shape and further comprises a fixture alignment slot on an outside surface of the disk.

12. The sensor package of claim 1, wherein a surface of the ring has a tongue and an outside edge of the electronics package has a reciprocal groove.

13. The sensor package of claim 1, wherein the ring further comprises a third mechanical mating interface in the shape of an arc and the base further comprises a fourth mechanical mating interface in the shape of an arc that is reciprocal to the third mechanical mating interface.

14. A method of assembling a sensor in a sensor package comprising:
aligning a first side of a ring to a base using a first mechanical mating interface in the shape of an arc on the ring and a second mechanical mating interface in the shape of an arc on the base, wherein the base has a sensor coupled to the base;
aligning an electronics package with a second side opposite the first side of the ring where the ring has a ledge recessed down from the second side designed to receive the electronics package;
filling via holes in the ring with a conductive material to form a plurality of vias such that a first electrical connection location on the base is electrically connected to a second electrical connection location on the electronics package, wherein each via of the plurality of vias terminates in a via termination point on the ledge and wherein each via termination point is surrounded by a recessed pocket;
partially filling either the first or second mechanical mating interface with an adhesive;
coupling the ring between the base and the electronics package; and
curing the adhesive such that the base and ring are affixed.

15. The method of claim 14, further comprising measuring a volume difference between the first mechanical mating interface and the second mechanical mating interface and metering an amount of adhesive used based on the volume difference.

16. The method of claim 14, wherein the first and second mechanical mating interfaces are a groove and protrusion combination.

17. The method of claim 14, wherein the conductive material is a conductive epoxy and the conductive epoxy is used as the adhesive.

18. The method of claim 14, further comprising filling the recessed pockets in the ring with conductive epoxy.

19. The method of claim 14, wherein the base is disk shaped and further comprises a fixture alignment slot on an outside surface of the disk.

20. The method of claim 14, wherein a surface of the ring has a tongue and an outside edge of the electronics package has a reciprocal groove and the tongue is assembled into the groove.

* * * * *